US007932553B2

(12) United States Patent
Yamaguchi et al.

(10) Patent No.: US 7,932,553 B2
(45) Date of Patent: Apr. 26, 2011

(54) SEMICONDUCTOR DEVICE INCLUDING A PLURALITY OF CELLS

(75) Inventors: Hitoshi Yamaguchi, Nisshin (JP);
Tsuyoshi Yamamoto, Kariya (JP)

(73) Assignee: Denso Corporation, Kariya (JP)

( * ) Notice: Subject to any disclaimer, the term of this patent is extended or adjusted under 35 U.S.C. 154(b) by 157 days.

(21) Appl. No.: 12/292,351

(22) Filed: Nov. 18, 2008

(65) Prior Publication Data

US 2009/0159963 A1  Jun. 25, 2009

(30) Foreign Application Priority Data

Dec. 24, 2007  (JP) ................................ 2007-331261

(51) Int. Cl.
*H01L 29/732* (2006.01)
(52) U.S. Cl. . 257/328; 257/329; 257/330; 257/E29.262; 257/E29.027; 438/212; 438/268
(58) Field of Classification Search .......... 257/334–336, 257/E29.262, 139, 205, 327–332, 347, 373, 257/E27.015, E29.122, E29.13, E29.134, 257/E21.41, E21.629, E21.643, E21.118, 257/E29.274, E29.313, E29.318, E29.257, 257/E21.382, E29.256, E29.027, 197, 372; 438/208, 268–274, 212, 259, 280, 587–589
See application file for complete search history.

(56) References Cited

U.S. PATENT DOCUMENTS

| 4,609,933 | A | * | 9/1986 | Nakajima et al. ............. 257/152 |
| 5,877,617 | A | * | 3/1999 | Ueda ............................. 323/316 |
| 6,180,966 | B1 | * | 1/2001 | Kohno et al. ................. 257/173 |
| 6,479,877 | B1 | | 11/2002 | Koyama et al. |
| 6,717,785 | B2 | | 4/2004 | Fukuda et al. |
| 7,238,576 | B2 | * | 7/2007 | Yamaguchi et al. .......... 438/268 |
| 7,385,250 | B2 | | 6/2008 | Omura et al. |
| 2002/0088990 | A1 | * | 7/2002 | Iwamoto et al. ............... 257/136 |
| 2004/0070013 | A1 | * | 4/2004 | Yamaguchi et al. .......... 257/288 |
| 2006/0170037 | A1 | * | 8/2006 | Yamauchi et al. ............. 257/330 |
| 2006/0284248 | A1 | * | 12/2006 | Saito et al. ..................... 257/341 |

FOREIGN PATENT DOCUMENTS

| JP | A-02-066975 | 3/1990 |
| JP | A-05-167077 | 7/1993 |
| JP | A-08-008422 | 1/1996 |
| JP | A-2000-323707 | 11/2000 |

OTHER PUBLICATIONS

Office Action mailed Feb. 16, 2010 from Japan Patent Office in corresponding JP Application No. 2007-331261 (and English translation).

* cited by examiner

*Primary Examiner* — Lynne A Gurley
*Assistant Examiner* — Yosef Gebreyesus
(74) *Attorney, Agent, or Firm* — Posz Law Group, PLC

(57) ABSTRACT

A semiconductor device includes an insulated gate transistor and a resistor. The insulated gate transistor includes a plurality of first cells for supplying electric current to a load and a second cell for detecting an electric current that flows in the first cells. A gate terminal of the plurality of first cells is coupled with a gate terminal of the second cell and a source terminal of the plurality of first cells is coupled with a source terminal of the second cell on a lower potential side. The resistor has a first terminal coupled with a drain terminal of the second cell and a second terminal coupled with a drain terminal of the first cells on a higher potential side. A gate voltage of the insulated gate transistor is feedback-controlled based on an electric potential of the resistor.

16 Claims, 7 Drawing Sheets

SEMICONDUCTOR DEVICE INCLUDING A PLURALITY OF CELLS

CROSS REFERENCE TO RELATED APPLICATIONS

The present application is based on and claims priority to Japanese Patent Application No. 2007-331261 filed on Dec. 24, 2007, the contents of which are incorporated in their entirety herein by reference.

BACKGROUND OF THE INVENTION

1. Field of the Invention

The present invention relates to a semiconductor device including a plurality of cells.

2. Description of the Related Art

Conventionally, an insulated gate transistor such as a power metal-oxide semiconductor field effect transistor (power MOSFET) and an insulated gate bipolar transistor (IGBT) used for a power device is made of an aggregation of a plurality of cells formed in a semiconductor substrate. In a semiconductor device including the insulated gate transistor made of the aggregation of the cells, the cells may be damaged if an overcurrent flows due to a short. Thus, the semiconductor device is required for deactivating the insulated gate transistor so that the overcurrent does not flow. In a case where the insulated gate transistor is used for controlling a rotation of a motor, the semiconductor device is required for controlling an electric current with a high degree of accuracy. In order to restrict a damage due to the overcurrent or control the electric current, a part of the cells may be used as a sensing cell for detecting the electric current as described, for example, in JP-A-2-66975, JP-A-8-8422, and U.S. Pat. No. 7,385,250 (corresponding to JP-A-2006-351985).

A semiconductor device 90 according to an example of the related art includes an N channel vertical power MOSFET made of an aggregation of a plurality of cells, as illustrated in FIG. 8. The aggregation of the cells is formed in a semiconductor substrate 10. The semiconductor substrate 10 includes a first N type (N+) semiconductor layer 1 made of a silicon substrate. The first N type semiconductor layer 1 functions as a drain region D. On the first N type semiconductor layer 1, a second N type (N) semiconductor layer 2 made of an epitaxial silicon layer is formed. An impurity concentration of the second semiconductor layer 2 is less than an impurity concentration of the first N type semiconductor layer. The second N type semiconductor layer 2 functions as a drift layer. On the second N type semiconductor layer 2, a P type semiconductor layer 3 made of an epitaxial silicon layer is formed. The P type semiconductor layer 3 functions as a channel-forming layer.

At a surface portion of the P type semiconductor layer 3, N type (N+) regions 4 are selectively formed. Each of the N type regions 4 function as a source region. At the surface portion of the P type semiconductor layer 3, P type regions 3a are also formed to be adjacent to the N type regions 4. Each of the P type regions 3a is coupled with a corresponding source electrode in common with the adjacent N type regions 4. Each of the P type regions 3a function as a contact region for fixing an electric potential at the P type semiconductor layer 3. Insulated gate electrodes 7 penetrate the P type semiconductor layer 3 so as to be adjacent to the N type regions 4. Each of the insulated gate electrodes 7 includes a trench, an insulating layer 5 disposed on an inner wall of the trench, and an embedded polysilicon 6 filled in the trench through the insulating layer 5. The N type regions 4, the P type regions 3a, and the insulated gate electrodes 7 are arranged in a stripe repeating pattern in a plane of the semiconductor substrate 10.

Each of the cells in the semiconductor device 90 is formed as a configurational repeating unit and has a diffusion structure similar to each other. The cells include main cells C1m and sensing cells C1s. The main cells C1m are provided for supplying an electric current to a load. The sensing sells C1s are provided for detecting the electric current that flows in the main cells C1m. The number of the main cells C1m is larger than the number of the sensing cells C1s. On a rear-surface side of the semiconductor substrate 10, the main cells C1m are coupled with a drain terminal D in common with the sensing cells C1s. In addition, on a front-surface side of the semiconductor substrate 10, the main cells C1m are coupled with a gate terminal G in common with the sensing cells C1s. The source electrodes of the main cells C1m are coupled with a main source terminal Sm. The source electrode of the sensing cells C1s is coupled with a sensing source terminal Ss.

The semiconductor device 90 can be coupled, for example, as an equivalent circuit illustrated in FIG. 9. The gate terminal G of the main cells C1m and the sensing cell C1s is coupled with a gate driving circuit. On a higher potential side, the drain terminal D of the main cells C1m and the sensing cell C1s is coupled with a power source having a voltage of Vdd through a load L. The main source terminal Sm is directly coupled with a ground GND. The sensing source terminal Ss is coupled with the ground GND through a resistor R1. The semiconductor device 90 detects an electric potential of the resistor R1, i.e., an electric potential of the sensing source terminal Ss. Then, the semiconductor device 90 compares the electric potential of the resistor R1 with a reference potential Ref, for example, the ground GND, using a comparator. Thereby, a main current Im that flows in the main cells C1m is detected, and the gate voltage of the insulated gate transistor is feedback-controlled, for example, by using a gate driving circuit.

In the semiconductor device 90, the first N type semiconductor layer 1 used as the drain region and the second N type semiconductor layer 2 used as the drift layer are shared by the main cells C1m and the sensing cell C1s. Thus, the main source terminal Sm for the main cells C1m and the sensing source terminal Ss for the sensing cell C1s are separately provided, and the resistor R1 is coupled with the sensing source terminal Ss. A sensing current Is that flows in the sensing cell C1s is set to be about thousandth part of the main current Im that flows in the main cells C1m. That is, the number or an area of the sensing cell C1s in the semiconductor device 90 is set to be about thousandth part of the number or an area of the main cells C1m. If the resistor R1 is coupled with the main source terminal Sm in which the main current Im flows, an electric current loss increases. Thus, the resistor R1 is coupled with the sensing source terminal Ss in which the sensing current Is is set to be about thousandth part of the main current Im flows. Therefore, the semiconductor device 90 can detect the main current Im while reducing the electric current loss. The semiconductor device 90 can restrict a damage due to an overcurrent and can control the main current Im by detecting the main current Im. Although a structure of each semiconductor device described in JP-A-2-66975, JP-A-8-8422, and U.S. Pat. No. 7,385,250 is different from a structure of the semiconductor device 90 illustrated in FIG. 8, the each semiconductor device detects an electric potential of a resistor or an electric potential of a sensing source terminal for restricting a damage due to the overcurrent or controlling a main current, in a manner similar to the above-described method.

In a transistor, when a gate-source voltage $V_{GS}$ exceeds a threshold voltage Vth, the transistor is activated and a drain current $I_D$ increases, as illustrated in FIG. 10. For example, the threshold voltage Vth is in a range from about 0.5 V to about 0.6 V, and the gate-source voltage $V_{GS}$ for activating the transistor is set to be about 1 V shown by the dashed-dotted line A1 in FIG. 10.

In the semiconductor device 90, when the transistor is activated, an electric potential equal to the product of the sensing current Is and the resistance R1 generates. The semiconductor device 90 detects the overcurrent by comparing the electric potential of the resistor R1 and the reference potential Ref using the comparator, for restricting a damage due to the overcurrent. When the transistor is activated and the above-described potential generates, the gate-source voltage $V_{GS}$ of the sensing cell C1s decreases as shown by the dashed-two dotted line A2 in FIG. 10 and results in difference between the gate-source voltage $V_{GS}$ of the main cells C1m and the gate-source voltage $V_{GS}$ of the sensing cell C1s. Therefore, a current density of the main cells C1m is different from a current density of the sensing cell C1s, and the semiconductor device 90 is difficult to detect the main current Im with a high degree of accuracy.

SUMMARY OF THE INVENTION

In view of the foregoing problems, it is an object of the present invention to provide a semiconductor device including a plurality of cells.

A semiconductor device according to an aspect of the invention includes an insulated gate transistor and a resistor. The insulated gate transistor includes a plurality of first cells for supplying electric current to a load and a second cell for detecting an electric current that flows in the first cells. The first cells and the second cell are located in a semiconductor substrate. A gate terminal of the plurality of first cells is coupled with a gate terminal of the second cell, and a source terminal of the plurality of first cells is coupled with a source terminal of the second cell on a lower potential side. The resistor has a first terminal and a second terminal. The first terminal is coupled with a drain terminal of the second cell. The second terminal is coupled with a drain terminal of the first cells on a higher potential side. A gate voltage of the insulated gate transistor is feedback-controlled based on an electric potential of the resistor.

In the present semiconductor device, an electric current that flows in the first cells can be detected with a high degree of accuracy.

BRIEF DESCRIPTION OF THE DRAWINGS

Additional objects and advantages of the present invention will be more readily apparent from the following detailed description of preferred embodiments when taken together with the accompanying drawings. In the drawings.

DETAILED DESCRIPTION OF THE PREFERRED EMBODIMENTS

Figure 1:
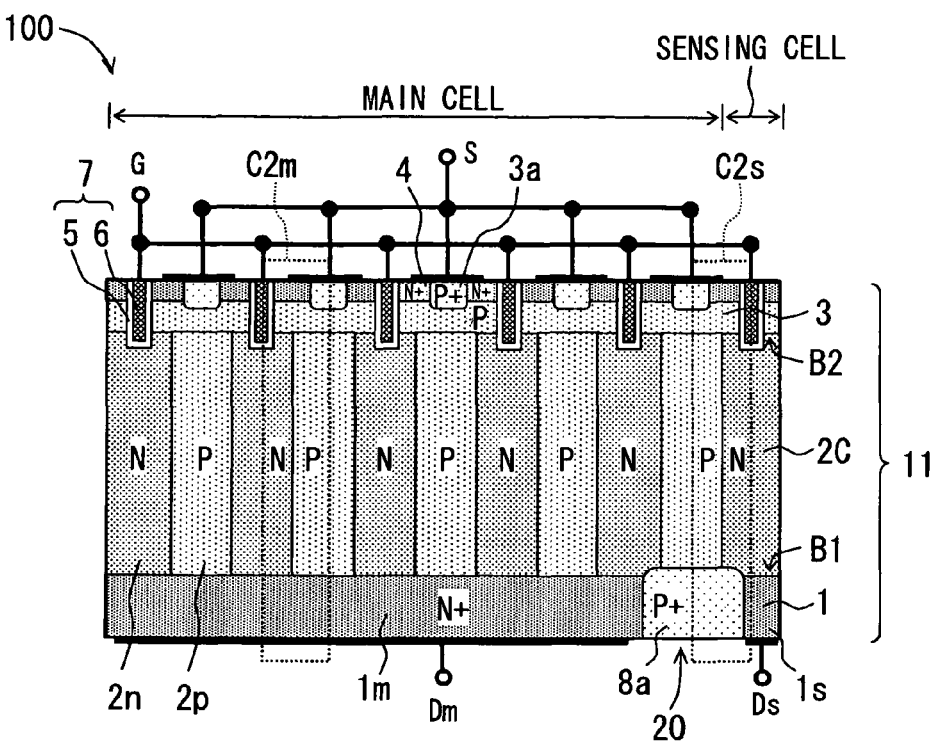
FIG. 1 is a cross-sectional view illustrating a semiconductor device according to an exemplary embodiment.

A semiconductor device 100 according to an exemplary embodiment of the invention will be described with reference to FIG. 1. The semiconductor device 100 includes an N channel power MOSFET made of an aggregation of a plurality of cells. Each of the cells is formed as a configurational repeating unit and has a diffusion structure similar to each other. The cells include a plurality of main cells C2m and at least one sensing cell C2s. The main cells C1m are provided for supplying an electric current to a load. The sensing cell C1s is provided for detecting a main current Im that flows in the main cells C2m. The number of the main cells C2m is larger than the number of the sensing cells C2s.

The semiconductor device 100 includes a semiconductor substrate 11. In the semiconductor substrate 11, P type columns 2p and N type columns 2n are alternately arranged in a direction approximately perpendicular to a thickness direction of the semiconductor substrate 11, for configurate a PN column layer 2C. Each of the P type columns 2p is in contact with the adjacent N type columns 2n. An N type (N+) semiconductor layer 1 is in contact with a first surface B1 of the PN column layer 2C. A P type (P) semiconductor layer 3 is in contact with a second surface B2 of the PN column layer 2C. The N type semiconductor layer 1 is made of a silicon substrate, for example. The PN column layer 2C is formed, for example, by the following method. At first, an N type epitaxial layer is formed on the N type semiconductor layer 1. Next, a plurality of trenches is provided in the N type epitaxial layer. Then, a P type epitaxial layer is formed so as to fill in the trenches. Thereby, the PN column layer 2C that includes the N type columns 2n and the P type columns 2p are formed. The P type semiconductor layer 3 is formed by forming a P type epitaxial layer on the PN column layer 2C.

The N channel power MOSFET in the semiconductor device 100 is a vertical insulated gate transistor. Each of the N type columns 2n can function as a drift region. The N type semiconductor layer 1 can function as a drain region D. The P type semiconductor layer 3 can function as a channel-forming layer. At a surface portion of the P type semiconductor layer 3, N type (N+) regions 4 are provided. Each of the N type regions 4 can function as a source region. At the surface portion of the P type semiconductor layer 3, p type regions 3a are also formed to be adjacent to the N type regions 4. Each of the P type regions 3a is coupled with a source electrode S in common with the adjacent N type regions 4. Each of the P type regions 3a can function as a contact region for fixing an electric potential of the P type semiconductor layer 3. Insulated gate electrodes 7 penetrate the P type semiconductor layer 3 so as to be adjacent to the N type regions 4. Each of the insulated gate electrodes 7 includes a trench, an insulating layer 5 disposed on an inner wall of the trench, and an embedded polysilicon 6 filled in the trench through the insulating layer 5. Thus, the N channel power MOSFET in the semiconductor device 100 is a trench-gate type insulated gate transistor including the insulated gate electrodes 7 each having a trench structure. The P type columns 2p, the N type columns 2n, the N type regions 4, the P type regions 3a, and the insulated gate electrodes 7 are arranged in a stripe repeating pattern in a plane of the semiconductor substrate 11.

The semiconductor device 100 includes a separating region 20. The separating region 20 penetrates the N type semiconductor layer 1 to one of the P type columns 2p. The separating region 20 surrounds the sensing cell C2s. The separating region 20 is provided by P type (P+) semiconductor region 8a. The separating region 20 electrically separates the N type semiconductor layer 1 into a first section 1m in which the main cells C2m are located and a second section 1s in which the sensing cell C2s is located. On a front-surface side of the semiconductor substrate 11, a source terminal S of the main cells C2m are coupled with a source terminal S of the sensing cell C2s. In addition, a gate terminal G of the main cells C2m is coupled with a gate terminal G of the sensing cell C2s. On a rear-surface side of the semiconductor device 100, the first section 1m, in which the main cells C2m are located, is coupled with a main drain terminal Dm. The second section 1s, in which the sensing cell C2s is located, is coupled with a sensing drain terminal Ds.

Figure 2:
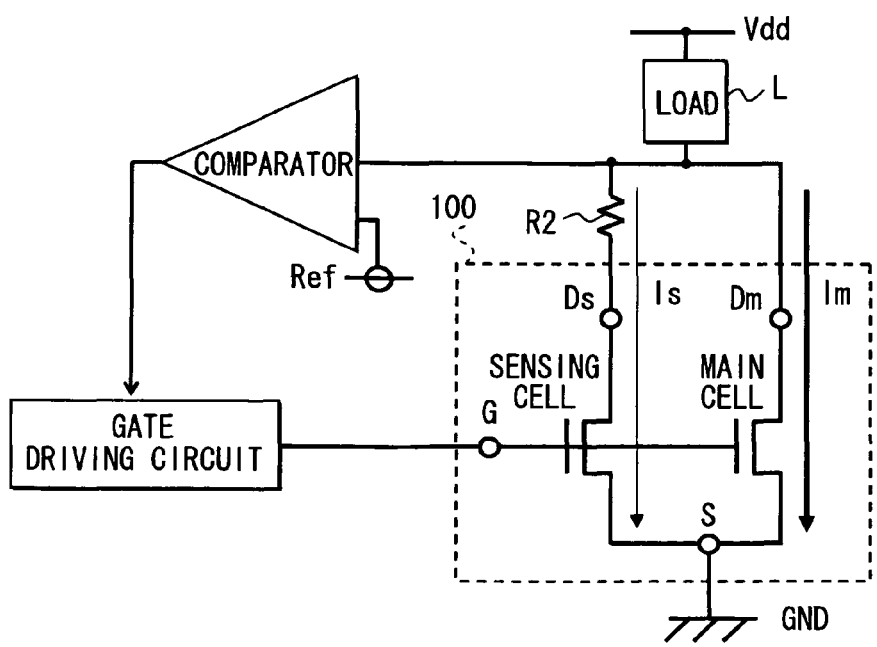
FIG. 2 is an equivalent circuit diagram illustrating an exemplary circuit including the semiconductor device.

The semiconductor device 100 can be coupled, for example, as an equivalent circuit illustrated in FIG. 2. The gate terminal G of the main cells C2m and the sensing cell C2s is coupled with a gate driving circuit. On a lower potential side, the source terminal S of the main cells C2m and the sensing cell C2s is directly coupled with a ground GND. One terminal of a resistor R2 is coupled with the sensing drain terminal Ds and the other terminal of the resistor R2 is coupled with the main drain terminal Dm on the higher potential side. The other terminal of the resistor R2 and the main drain terminal Dm are coupled with a power source having a voltage of Vdd through a load L. The semiconductor device 100 detects an electric potential of the resistor R2, i.e., an electric potential of the main drain terminal Dm. Then, the semiconductor device 100 compares the electric potential of the resistor R2 with a reference potential Ref, for example, the ground GND, using a comparator. Thereby, the main current Im that flows in the main cells C2m is detected and the gate voltage of the insulated gate transistor is feedback-controlled, for example, by using the gate driving circuit.

As described above, the semiconductor device 100 includes the insulated gate transistor made of the aggregation of the main cells C2m and the sensing cell C2s formed in the semiconductor substrate 11. The sensing cell C2s are provided for detecting the main current Im that flows in the main cell C2m. By detecting the main current Im using the sensing cell C2s, the semiconductor device 100 can restrict a damage due to an overcurrent and can control the main current Im.

In the semiconductor device 100, the source terminal S is coupled with the main cells C2m and the sensing cell C2s on the lower potential side. On the higher potential side, the main drain terminal Dm is coupled with the main cells C2m and the sensing drain terminal Ds is coupled with the sensing cell C2s. The one terminal of the resistor R2 is coupled with the sensing drain terminal Ds, and the other terminal of the resistor R2 is coupled with the main drain terminal Dm. The semiconductor device 100 detects the main current Im based on the electric potential of the resistor R2. The resistor R2 is coupled on the drain-side of the sensing cell C2s. Even if an electric potential generates at the resistor R2 when the transistor is activated, a gate-source voltage $V_{GS}$ of the main cells C2m and a gate-source voltage $V_{GS}$ of the sensing cell C2s are substantially equal to each other. Although the electric potential of the sensing drain terminal Ds is only slightly different from the electric potential of main drain terminal Dm, each drain current is less affected by the electric potential of the corresponding drain terminal.

Figure 3:
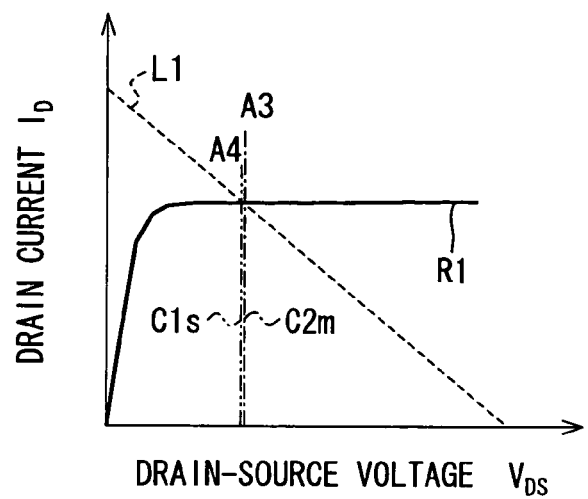
FIG. 3 is a graph illustrating a relationship between a drain-source voltage and a drain current.

A principle of detecting the electric current in the semiconductor device 100 will now be described with reference to FIG. 3. A relationship between the drain-source voltage $V_{DS}$ and the drain current $I_D$ is shown by the solid line R1. A load line is shown by the dashed line L1. The transistor is operated in the vicinity of the intersection of the solid line R1 with the dashed line L1. A region where the drain current $I_D$ is saturated with respect to the drain-source voltage $V_{DS}$ is shown by the dashed-dotted line A3. The intersection is located on the dashed-dotted line A3.

When the transistor is activated, the electric potential equal to the product of the sensing current Is and the resistor R2 generates. The semiconductor device 100 detects the overcurrent by comparing the electric potential of the resistor R2 and the reference potential Ref using the comparator and feedbacks the detecting result to a gate control signal. Thereby, the semiconductor device 100 restricts a damage due to the overcurrent. In the semiconductor device 100, the resistor R2 is arranged on the drain side. Thus, even when the transistor is activated and the above-described electric potential generates at the resistor R2, the gate-source voltage $V_{GS}$ of the main cells C2m is substantially equal to the gate-source voltage $V_{GS}$ of the sensing cell C2s, and the drain-source voltage $V_{DS}$ of the main cells C2m is only slightly different from the drain-source voltage $V_{DS}$ of the sensing cell C2s. Even if the drain-source voltage $V_{DS}$ of the sensing cell C2s decreases slightly, as shown by the dashed-two dotted line A4, the drain current $I_D$ of the main cells C2m is rarely different from the drain current $I_D$ of the sensing cell C2s. Therefore, the current density of the main cells C2m is substantially equal to current density of the sensing cell C2s, and the semiconductor device 100 can detect the main current Im with a high degree of accuracy.

The semiconductor device 100 includes the vertical insulated gate transistor including the PN column layer 2C. In the PN column layer 2C, the P type columns 2p and the N type columns 2n are alternately arranged so as to be in contact with each other. The semiconductor device 100 can use the PN column layer 2C as a super-junction structure part. In a case where the semiconductor device 100 includes the N channel power MOSFET, as illustrated in FIG. 1, the N type columns 2n in the PN column layer 2C can function as the drift regions of carrier when the transistor is activated. The N type columns 2n are separated from each other by the P type columns 2p. When an impurity concentration of the N type columns 2n is increased, an on-resistance of the vertical insulated gate transistor formed in the semiconductor substrate 11 can be reduced. When a width of each of the N type columns 2n and an impurity concentration of the P type columns 2p are set to be predetermined values, a depleted layer expands from the P type columns 2p to the N type columns 2n and the PN column layer 2C can be fully-depleted when the transistor is deactivated. In this way, the insulated gate transistor formed in the semiconductor device 100 including the PN column layer 2C can have a high breakdown voltage and a low on-resistance.

Figure 8:
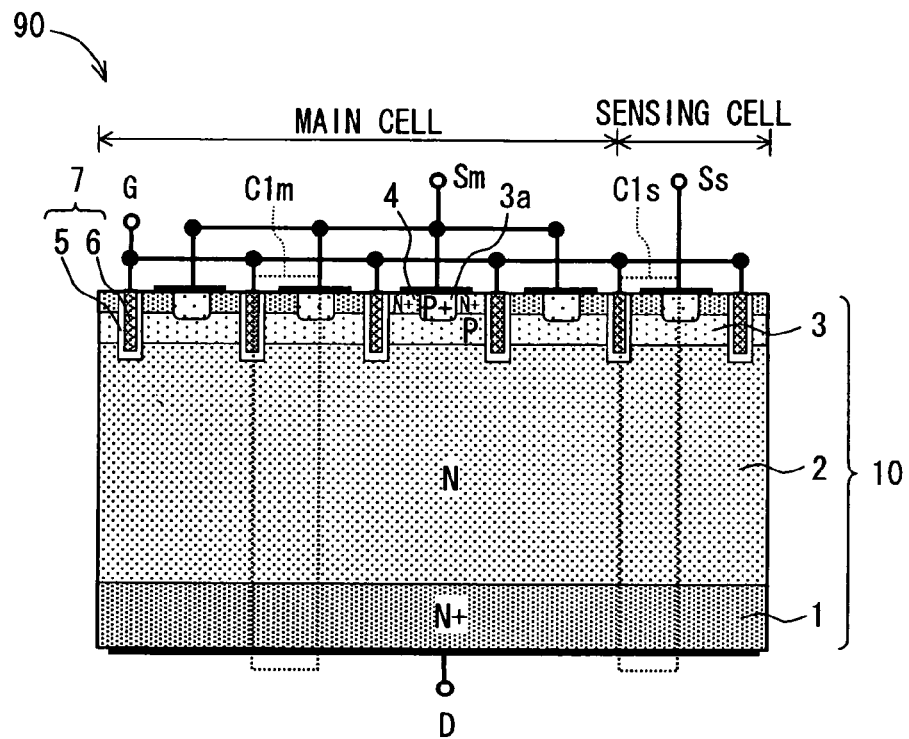
FIG. 8 is a cross-sectional view illustrating a semiconductor device according to an example of the related art.
Figure 9:
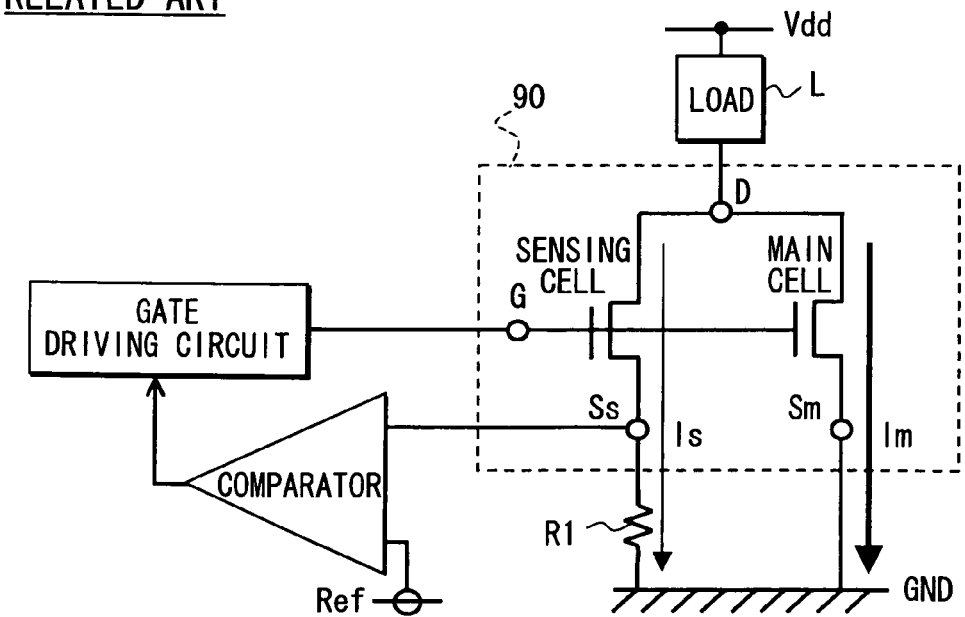
FIG. 9 is an equivalent circuit diagram illustrating an exemplary circuit including the semiconductor device according to the example of the related art.
Figure 10:
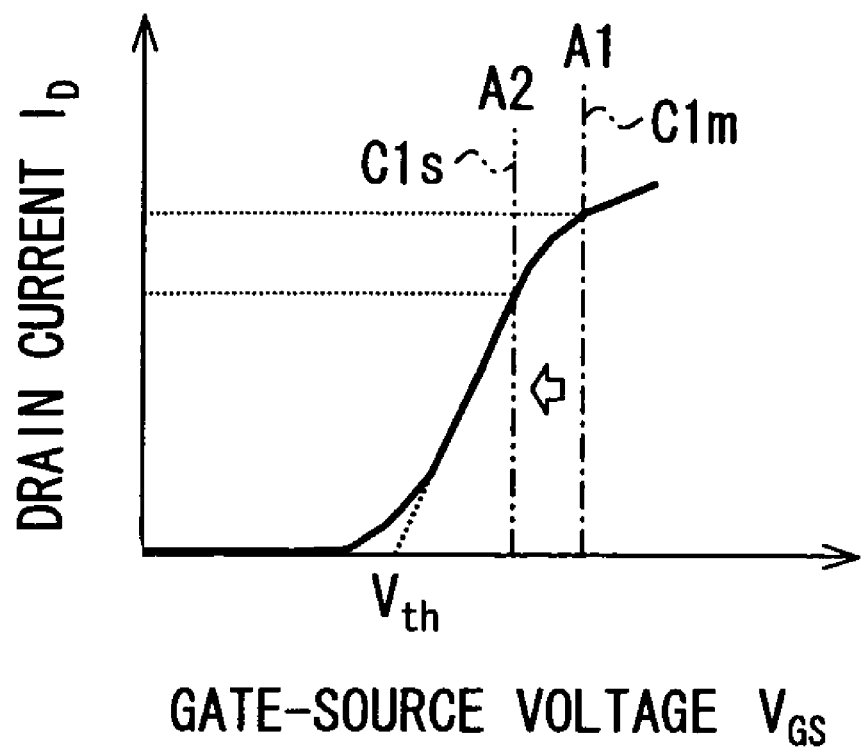
FIG. 10 is a graph illustrating a relationship between a gate-source voltage and a drain current.

In the semiconductor device 100 illustrated in FIG. 1, the PN column layer 2C is formed at a center portion of a cross section of the semiconductor substrate 11. The N type semiconductor layer 1 that can function as the drain region is divided into the first section 1m and the second section 1s by the separating region 20. The first section 1m is coupled with the main drain terminal Dm of the main cells C2m, and the second section 1s is coupled with the sensing drain terminal Ds of the sensing cell C2s. The main drain terminal Dm and the sensing drain terminal Ds are separately provided. Thereby, the resistor R2 can be coupled with the sensing drain terminal Ds, as illustrated in FIG. 2. The main drain terminal Dm and the sensing drain terminal Ds can be separately provided because the semiconductor device 100 includes the vertical gate transistor including the PN column layer 2C. If the semiconductor device 100 uses a homogeneous N type semiconductor layer 2 as a drift layer, in a manner similar to the semiconductor device 90 illustrated in FIG. 8, the main drain terminal Dm and the sensing drain terminal Ds are difficult to be provided separately.

In the semiconductor device 100 illustrated in FIG. 1, the separating region 20 made of the P type (P+) semiconductor region 8a is provided for electrically separating the first section 1m and the second section 1s of the N type semiconductor layer 1. A semiconductor device 101 according to a first modification of the exemplary embodiment has a separating region 21 that surrounds the sensing cell C2s. The separating region 21 includes a trench 9 penetrating the N type semiconductor layer 1 to one of the P type columns 2p and an insulating member 8b filled in the trench 9. A semiconductor device 102 according to a second modification of the exemplary embodiment has a separating region 22 that surrounds the sensing cell C2s. The separating region 22 includes a trench 9 penetrating the N type semiconductor layer 1 to one of the P type columns 2p and an insulating layer 8c disposed on a surface of the trench 9. The separating regions 21 and 22 can electrically separate the first section 1m and the second section 1s of the N type semiconductor layer 1 in a manner similar to the separating region 20 in the semiconductor device 100. Thus, also in the semiconductor devices 101 and 102, the resistor R2 can be coupled with the sensing drain terminal Ds of the sensing cell C2s, and the semiconductor devices 101 and 102 can detect the main current Im that flows in the main cells C2m with a high degree of accuracy.

Figure 5A:
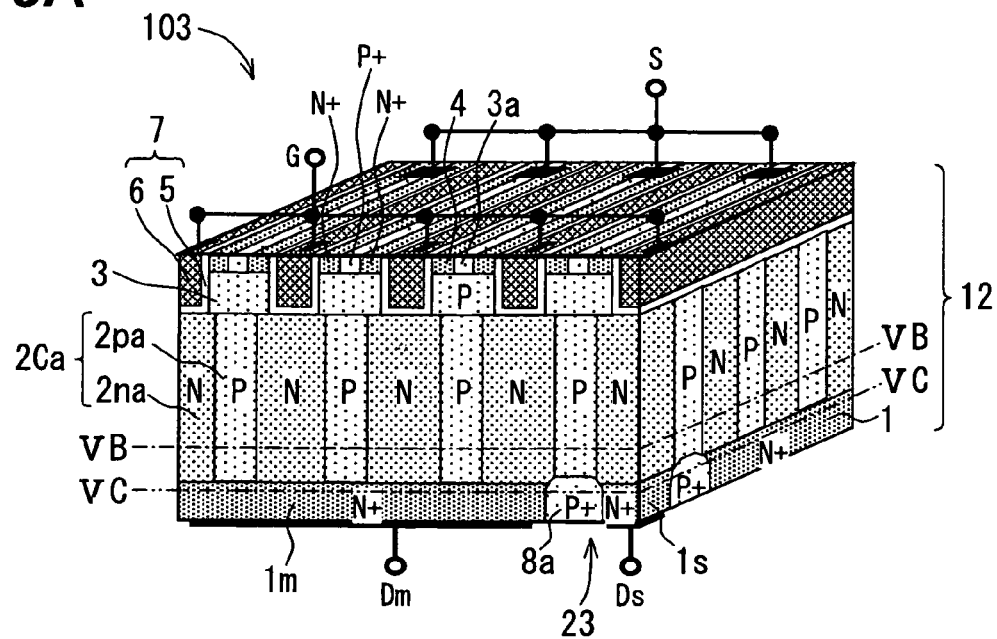
FIG. 5A is a perspective view illustrating a semiconductor device according to a third modification of the exemplary embodiment.
Figure 5B:
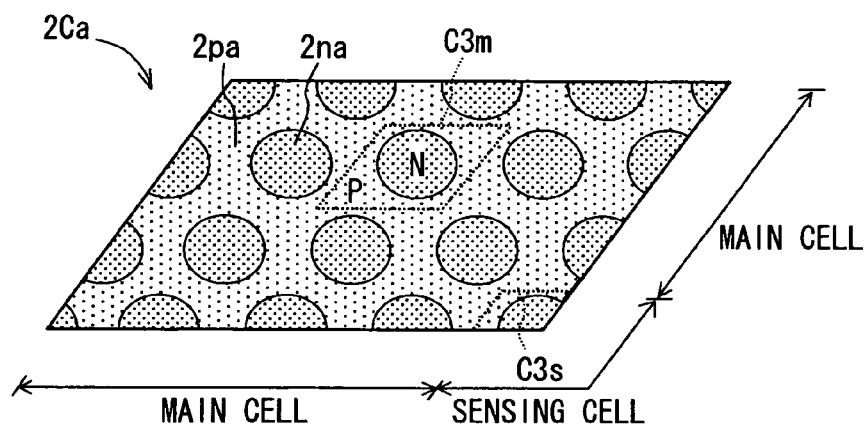
FIG. 5B is a cross-sectional view illustrating the semiconductor device taken along line VB-VB in FIG. 5A.
Figure 5C:
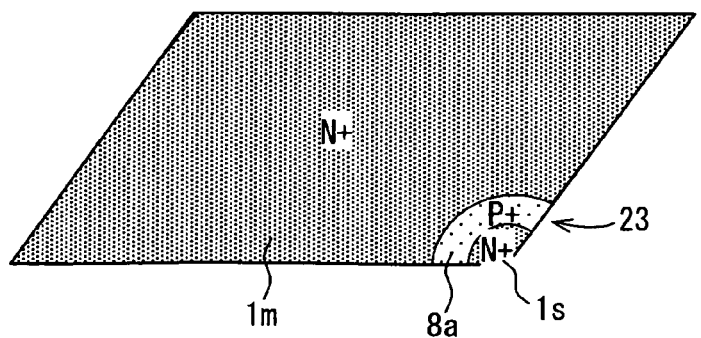
FIG. 5C is a cross-sectional view illustrating the semiconductor device taken along line VC-VC in FIG. 5B.

A semiconductor device 103 according to a third modification of the exemplarily embodiment will be described with reference to FIG. 5A-FIG. 5C. The semiconductor device 103 includes a semiconductor substrate 12. In the semiconductor substrate 12, a PN column layer 2Ca including a P type column 2pa and a plurality of N type columns 2na is formed. Each of the N type columns 2na has an approximately circular column shape extending in the thickness direction of the semiconductor substrate 12. The P type columns 2pa surrounds the respective N type columns 2na. That is, the PN column layer 2Ca has a circular repeating pattern. The semiconductor device 103 includes main cells C3, a sensing cell C3s, and a separating region 23 for electrically separating the N type semiconductor layer 1 into a first section 1m where the main cells C3m are located and a second section 1s where the sensing cell C3s is located. Thus, also in the semiconductor device 103, the resistor R2 can be coupled with the sensing drain terminal Ds of the sensing cell C3, and the semiconductor device 103 detect the main current Im that flows in the main cell C3m with a high degree of accuracy.

The PN column layer 2Ca has the circular repeating pattern of the N type columns 2na. Thus, a ratio of the area of the sensing cell C3s with respect to the area of the main cells C3m can be reduced compared with the semiconductor device 100 that includes the PN column layer 2C having the stripe repeating pattern. Thus, in the semiconductor device 103, a use efficiency of the semiconductor substrate 12 can be improved. The shape of each of the N type columns 2na is not limited to the approximately circular column. For example, each of the N type columns 2na may have an approximately polygonal column shape.

Figure 6A:
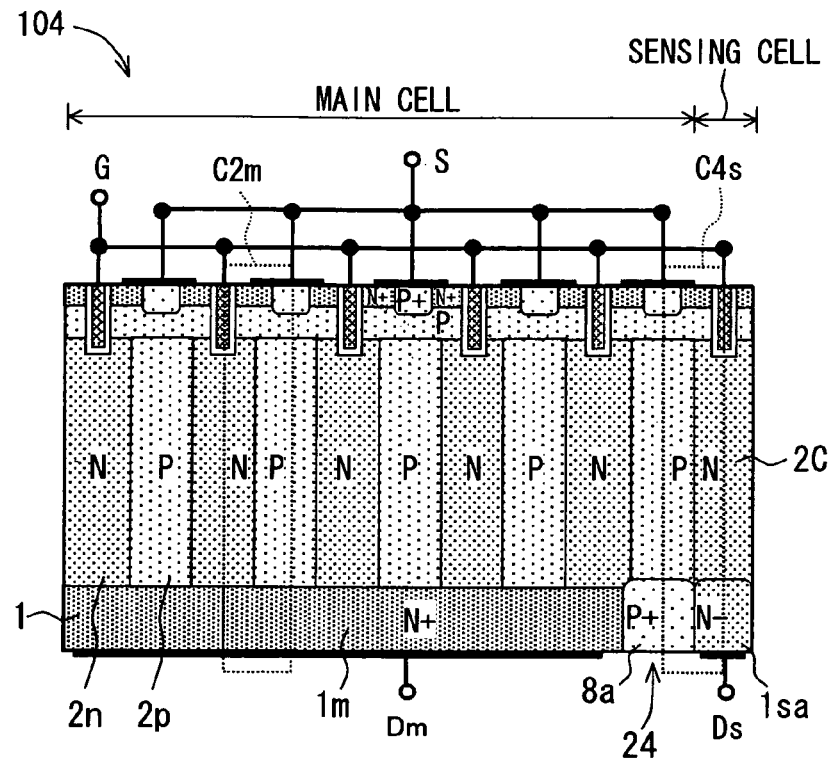
FIG. 6A is a cross-sectional view illustrating a semiconductor device according to a fourth modification of the exemplary embodiment and FIG. 6B is a cross-sectional view illustrating a semiconductor device according to a fifth modification of the exemplary embodiment.
Figure 6B:
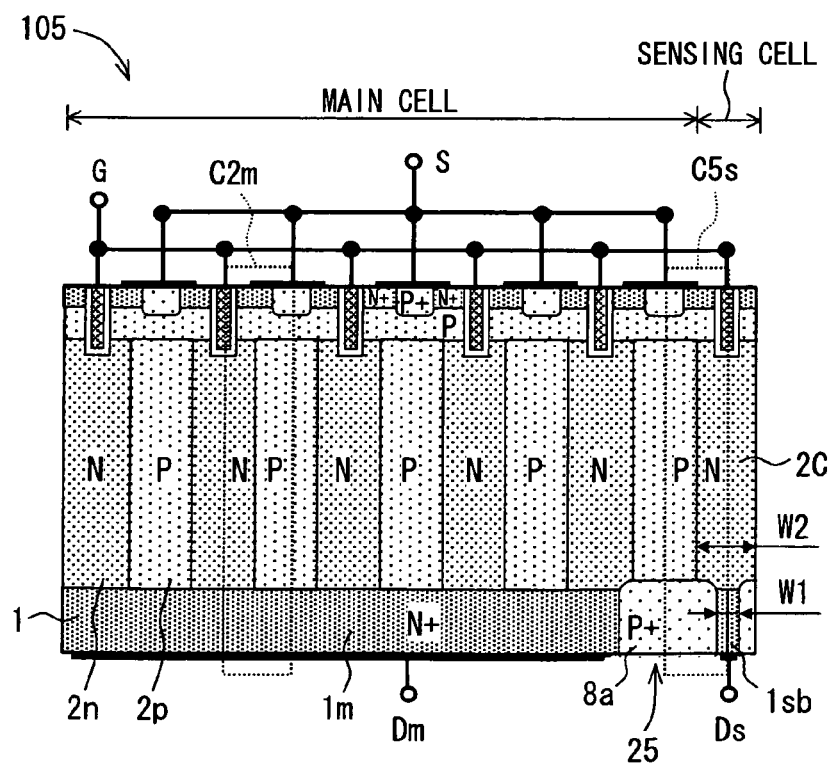

A semiconductor device 104 according to a fourth modification of the exemplary embodiment includes a separating region 24 made of the P type semiconductor region 8a, as illustrated in FIG. 6A. The separating region 24 electrically separates the N type semiconductor layer 1 into the first section 1m where the main cells C2m are located and a second section 1sa where a sensing cell C4s is located. An impurity concentration (N−) of the second section 1sa is set to be lower than an impurity concentration (N+) of the first section 1m. In the present case, the second section 1sa can be used as the resistor R2 illustrated in FIG. 2. A semiconductor device 105 according to a fifth modification of the exemplary embodiment includes a separating region 25 made of the P type semiconductor region 8a, as illustrated in FIG. 6B. The separating region 25 electrically separates the N type semiconductor layer 1 into the first section 1m where the main cells C2m are located and a second section 1sb where a sensing cell C5s is located. In the present case, a width W1 of the second section 1sb is set to be narrower than a width W2 of each of the N type columns 2n. Thereby, the second section 1sb can be used as the resistor R2 illustrated in FIG. 2. Because the semiconductor devices 104 and 105 have the resistor R2 in the semiconductor substrate, an external resistor is not required. Thus, a production cost of the semiconductor devices 104 and 105 can be reduced compared with the semiconductor device 100 illustrated in FIG. 1.

Each of the insulated gate transistors formed in the semiconductor devices 100-105 is the trench-gate type insulated gate transistor having the insulated gate electrodes 7 extending to the respective N type columns 2n through the P type semiconductor layer 3. Each of the insulated gate transistors having the PN column layer 2C or 2Ca may also be a planer-gate type insulated gate transistor. The trench-gate type insulated gate transistor can have a high integration and a low on-resistance compared with the planer-gate type insulated gate transistor.

Each of the insulated gate transistors formed in the semiconductor devices 100-105 is a power MOSFET. An insulated gate transistor formed in a semiconductor device having a PN column layer may also be an insulated gate bipolar transistor (IGBT).

Furthermore, a utilization of the semiconductor device 100 illustrated in the equivalent circuit diagram in FIG. 2 is not limited to the semiconductor devices 100-105 illustrated in FIG. 1 and FIG. 4-FIG. 6.

Figure 7:
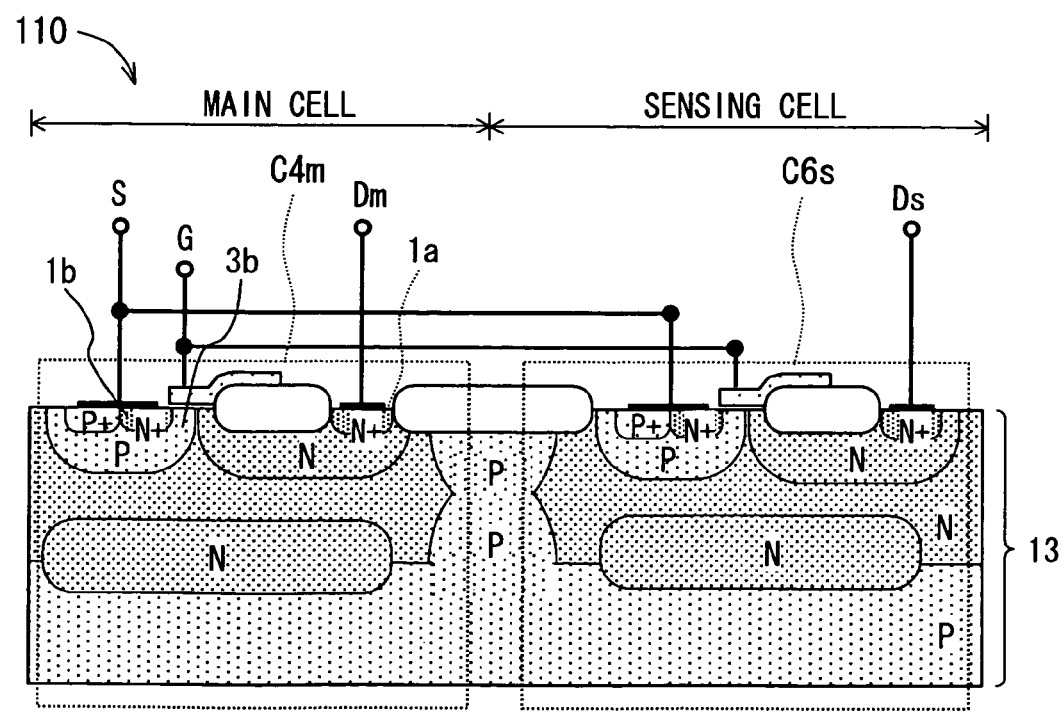
FIG. 7 is a cross-sectional view illustrating a semiconductor device according to a sixth modification of the exemplary embodiment.
Figure 4A:
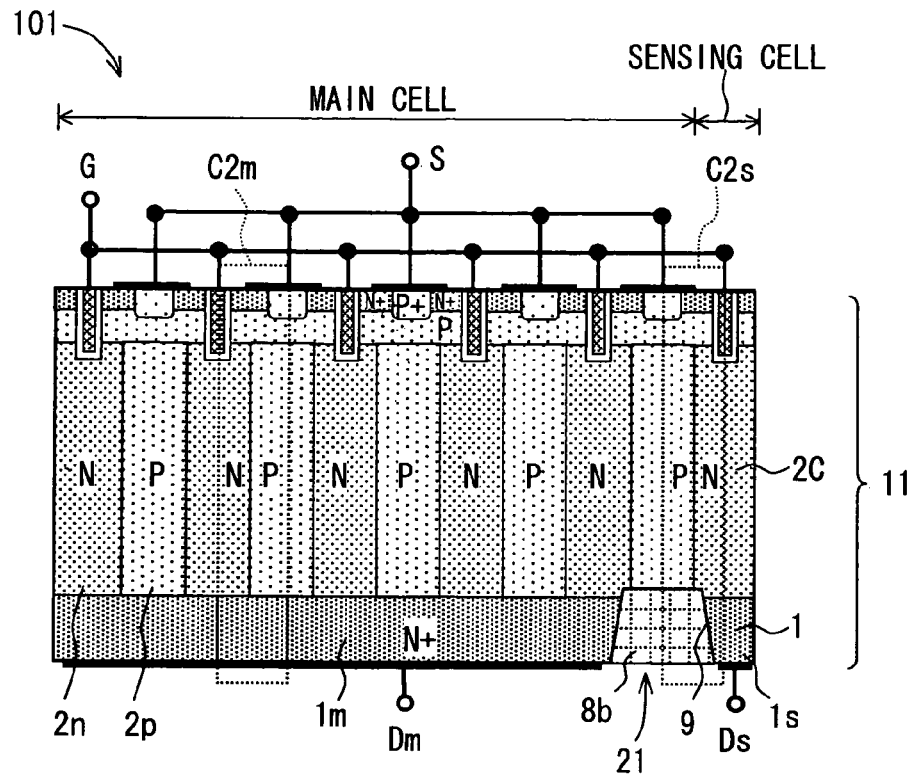
FIG. 4A is a cross-sectional view illustrating a semiconductor device according to a first modification of the exemplary embodiment and FIG. 4B is a cross-sectional view illustrating a semiconductor device according to a second modification of the exemplary embodiment.
Figure 4B:
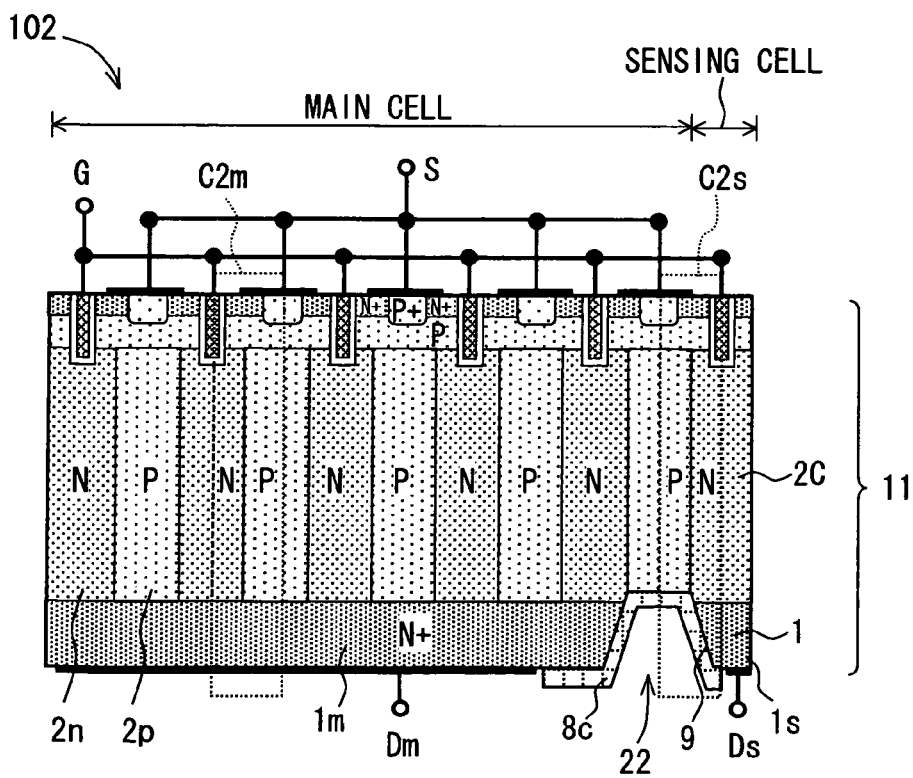

A semiconductor device 110 according to a sixth embodiment of the exemplary embodiment will now be described with reference to FIG. 7. In FIG. 7, only one main cell C4m and one sensing cell C6s are illustrated as sake of convenience.

An insulated gate transistor formed in the semiconductor device 110 is a lateral insulated gate transistor. The semiconductor device 110 includes a semiconductor substrate 13. At a surface portion the semiconductor substrate 13, N type regions 1a and 1b are separately formed so that a P type region 3b is located therebetween. The N type region 1a can function as a drift region, the N type region 1b can function as a source region, and the P type region can function as a channel-forming layer.

In the semiconductor device 110, source electrodes and drain electrodes are formed on a front-surface side of the semiconductor substrate 13. The main drain terminal Dm coupled with the main cell C4m and the sensing drain terminal Ds coupled with the sensing cell C6s can be separately provided. The resistor R2 illustrated in FIG. 2 can be coupled with the sensing drain terminal Ds of the sensing cells C6s, and thereby the main current Im that flows in the main cell C4m can be detected with a high degree of accuracy.

As described above, each of the semiconductor devices 100-105 and 110 includes the insulated gate transistor made of the aggregation of the cells formed in corresponding one of the semiconductor substrates 11-13. The cells include one of the sensing cells C2s-C6s for detecting the main current Im that flows in the corresponding one of the main cells C2m-C4m. Thus, the main current Im that flows in the main cells C2m-C4m can be detected with a high degree of accuracy. For example, each of the semiconductor devices 100-105 and 110 can be suitable used for a vehicle because a semiconductor device provided on the vehicle is required for restricting damage due to an overcurrent and a controlling electric current so as to control a rotation of a motor.

A semiconductor device coupled in the equivalent circuit illustrated in FIG. 2 is not limited to a semiconductor device including an insulated gate transistor. For example, a semiconductor device including a bipolar transistor or a thyristor can be coupled in the equivalent circuit illustrated in FIG. 2.

What is claimed is:

1. A semiconductor device comprising:
   an insulated gate transistor including a plurality of first cells for supplying electric current to a load and a second cell for detecting an electric current that flows in the plurality of first cells, the plurality of first cells and the second cell located in a semiconductor substrate, a gate terminal of the plurality of first cells coupled with a gate terminal of the second cell, a source terminal of the plurality of first cells coupled with a source terminal of the second cell on a lower potential side; and
   a resistor including a first terminal and a second terminal, the first terminal coupled with a drain terminal of the second cell, the second terminal coupled with a drain terminal of the plurality of first cells on a higher potential side, wherein
   a gate voltage of the insulated gate transistor is feedback-controlled based on an electric potential of the resistor,
   the insulated gate transistor is a vertical insulated gate transistor, and
   the semiconductor substrate comprises:
   a PN column layer having a first surface and a second surface and including a plurality of first columns having a first conductivity type and a plurality of second columns having a second conductivity type, the plurality of first columns and the plurality of second columns alternately arranged so as to be in contact with each other, each of the plurality of second columns providing a drift region;
   a first semiconductor layer having the first conductivity type and being in contact with the first surface of the PN column layer, the first semiconductor layer providing a channel-forming layer;
   a second semiconductor layer having the second conductivity type and being in contact with the second surface of the PN column layer, the second semiconductor layer providing a drain region;
   a plurality of second conductivity-type regions having the second conductivity type and disposed at a surface portion of the first semiconductor layer, each of the plurality of second conductivity-type regions providing a source region; and
   a separating region penetrating the second semiconductor layer to one of the plurality of first columns in such a manner that the separating region surrounds the second cell in a plane of the semiconductor substrate and the separating region divides the second semiconductor layer into a first section coupled with the drain terminal of the plurality of first cells and a second section coupled with the drain terminal of the second cell.

2. The semiconductor device according to claim 1, further comprising one or more of the second cell, wherein:
   the number of the plurality of first cells is larger than the number of a plurality of second cells;
   each of the plurality of first cells is a main cell; and
   each of the plurality of second cells is a sensing cell.

3. The semiconductor device according to claim 1, wherein the plurality of first columns and the plurality of second columns are arranged in a stripe repeating pattern.

4. The semiconductor device according to claim 1, wherein the semiconductor substrate further includes a plurality of gate electrodes penetrating the first semiconductor layer to respective ones of the plurality of second columns.

5. The semiconductor device according to claim 1, wherein the separating region has the first conductivity type.

6. The semiconductor device according to claim 1, wherein the separating region is an insulating region.

7. The semiconductor device according to claim 6, wherein the insulating region includes:
   a trench surrounding the second cell in the plane of the semiconductor substrate and penetrating the second semiconductor layer to the one of the plurality of first columns; and
   an insulating member filled in the trench.

8. The semiconductor device according to claim 6, wherein the insulating region includes:
   a trench surrounding the second cell in the plane of the semiconductor substrate and penetrating the second semiconductor layer to the one of the plurality of first columns; and
   an insulating layer disposed on a surface of the trench.

9. The semiconductor device according to claim 1, wherein:
   the first section has a first impurity concentration;
   the second section has a second impurity concentration;
   the second impurity concentration is less than the first impurity concentration; and
   the second section provides the resistor.

10. The semiconductor device according to claim 1, wherein:
    each of the plurality of second columns has a first width;
    the second section has a second width;
    the second width is less than the first width; and
    the second section provides the resistor.

11. The semiconductor device according to claim 1, wherein
    the vertical insulated gate transistor is one of a power metal-oxide semiconductor field-effect transistor and an insulated gate bipolar transistor.

12. The semiconductor device according to claim 1, wherein the insulated gate transistor is a vertical insulated gate transistor and the semiconductor substrate includes:
    a PN column layer having a first surface and a second surface and including a first columns having a first conductivity type and a plurality of second columns having a second conductivity type, each of the plurality of second columns being surrounded by the first columns, each of the plurality of second columns providing a drift region;

a first semiconductor layer having the first conductivity type and being in contact with the first surface of the PN column layer, the first semiconductor layer providing a channel-forming layer;

a second semiconductor layer having the second conductivity type and being in contact with the second surface of the PN column layer, the second semiconductor layer providing a drain region;

a plurality of second conductivity-type regions having the second conductivity type and disposed at a surface portion of the first semiconductor layer, each of the plurality of second conductivity-type regions providing a source region; and a separating region penetrating the second semiconductor layer to the first column in such a manner that the separating region surrounds the second cell in the plane of the semiconductor substrate and the separating region electrically separates the second semiconductor layer into a first section coupled with the drain terminal of the plurality of first cells and a second section coupled with the drain terminal of the second cell.

13. The semiconductor device according to claim 12, wherein each of the plurality of second columns has an approximately circular column shape or an approximately polygonal column shape.

14. The semiconductor device according to claim 1, wherein:
the insulated gate transistor is a lateral insulated gate transistor;
the lateral insulated gate transistor has a channel-forming layer, a drift region, and a source region located at a surface portion of the semiconductor substrate;
the channel-forming layer has a first conductivity type;
each of the drift region and the source region has a second conductivity type; and
the channel-forming layer is located between the drift region and the source region.

15. The semiconductor device according to claim 1, wherein the insulated gate transistor is configured to be disposed in a vehicle.

16. The semiconductor device according to claim 1, further comprising:
a comparator coupled with the resistor for detecting the electric potential of the resistor; and
a gate driving circuit coupled with the comparator, the gate terminal of the plurality of first cells, and the gate terminal of the second cell for controlling the gate voltage of the insulated gate transistor based on the electric potential of the resistor detected by the comparator.

* * * * *